United States Patent
Li et al.

(10) Patent No.: US 11,024,361 B2
(45) Date of Patent: Jun. 1, 2021

(54) COINCIDENT MEMORY BANK ACCESS VIA CROSS CONNECTED SHARED BANK RESOURCES

(71) Applicant: QUALCOMM INCORPORATED, San Diego, CA (US)

(72) Inventors: Yanru Li, San Diego, CA (US); Dexter Chun, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 744 days.

(21) Appl. No.: 15/400,507

(22) Filed: Jan. 6, 2017

(65) Prior Publication Data
US 2018/0197594 A1   Jul. 12, 2018

(51) Int. Cl.
*G11C 11/408* (2006.01)
*G11C 11/406* (2006.01)
*G11C 11/4091* (2006.01)
*G11C 8/12* (2006.01)

(52) U.S. Cl.
CPC ............. *G11C 11/408* (2013.01); *G11C 8/12* (2013.01); *G11C 11/406* (2013.01); *G11C 11/4091* (2013.01); *G11C 11/40603* (2013.01); *G11C 11/40618* (2013.01)

(58) Field of Classification Search
CPC ... G11C 8/12; G11C 11/406; G11C 11/40603; G11C 11/40618; G11C 11/408; G11C 11/4091
See application file for complete search history.

(56) References Cited

U.S. PATENT DOCUMENTS

| | | | |
|---|---|---|---|
| 5,412,788 | A | 5/1995 | Collins et al. |
| 6,091,659 | A | 7/2000 | Watanabe et al. |
| 6,125,071 | A | 9/2000 | Kohno et al. |
| 6,327,214 | B1 | 12/2001 | Yoon et al. |
| 6,453,370 | B1 | 9/2002 | Stracovsky et al. |

(Continued)

FOREIGN PATENT DOCUMENTS

| | | |
|---|---|---|
| CN | 104781885 A | 7/2015 |
| WO | 2009105362 A1 | 8/2009 |

OTHER PUBLICATIONS

Mitsubishi Electric Corporation; The Hierarchical Multi-Bank DRAM: A High-Performance Architecture for Memory Integrated with Processors; Stanford University Web Page; Accessed on Aug. 8, 2016; http://www-hydra.stanford.edu; 17 pages.

(Continued)

*Primary Examiner* — Richard Elms
*Assistant Examiner* — R Lance Reidlinger
(74) *Attorney, Agent, or Firm* — Smith Tempel Blaha LLC/Qualcomm

(57) ABSTRACT

Systems, methods, and computer programs are disclosed for providing coincident memory bank access. One embodiment is a memory device comprising a first bank, a second bank, a first bank resource, and a second bank resource. The first bank has a first set of bitlines for accessing a first set of rows in a first memory cell array. The second bank has a second set of bitlines for accessing a second set of rows in a second memory cell array. The first bank resource and the second bank resource are selectively connected to the first set of bitlines or the second set of bitlines via a cross-connect switch.

12 Claims, 12 Drawing Sheets

(56) References Cited

U.S. PATENT DOCUMENTS

| | | | |
|---|---|---|---|
| 6,469,945 B2 | 10/2002 | Patti et al. | |
| 6,603,705 B2 | 8/2003 | Chen et al. | |
| 6,622,225 B1 | 9/2003 | Kessler et al. | |
| 6,954,387 B2 * | 10/2005 | Kim | G11C 11/406 365/189.12 |
| 6,965,528 B2 | 11/2005 | Lee et al. | |
| 7,088,604 B2 | 8/2006 | Shirley et al. | |
| 8,291,174 B2 | 10/2012 | Resnick | |
| 8,441,135 B2 * | 5/2013 | Yoko | G11C 5/063 257/48 |
| 9,256,523 B2 | 2/2016 | Takizawa | |
| 9,286,965 B2 * | 3/2016 | Perego | G11C 11/40603 |
| 9,406,388 B2 | 8/2016 | De et al. | |
| 9,779,798 B1 * | 10/2017 | Li | G11C 8/12 |
| 9,959,205 B2 * | 5/2018 | Wang | G11C 13/0021 |
| 2008/0123423 A1 * | 5/2008 | Kim | G06F 3/0659 365/185.11 |
| 2008/0186782 A1 | 8/2008 | Yun | |
| 2014/0177370 A1 | 6/2014 | Halbert et al. | |
| 2014/0181387 A1 * | 6/2014 | Poremba | G06F 12/0886 711/105 |
| 2015/0019803 A1 | 1/2015 | Miller et al. | |

OTHER PUBLICATIONS

International Search Report and Written Opinion—PCT/US2017/066440—ISA/EPO—dated Mar. 23, 2018.

* cited by examiner

COINCIDENT MEMORY BANK ACCESS VIA CROSS CONNECTED SHARED BANK RESOURCES

DESCRIPTION OF THE RELATED ART

Portable computing devices (e.g., cellular telephones, smart phones, tablet computers, portable digital assistants (PDAs), portable game consoles, wearable devices, and other battery-powered devices) and other computing devices continue to offer an ever-expanding array of features and services, and provide users with unprecedented levels of access to information, resources, and communications. To keep pace with these service enhancements, such devices have become more powerful and more complex. Portable computing devices now commonly include a system on chip (SoC) comprising a plurality of memory clients embedded on a single substrate (e.g., one or more central processing units (CPUs), a graphics processing unit (GPU), digital signal processors, etc.). The memory clients may read data from and store data in a dynamic random access memory (DRAM) memory system electrically coupled to the SoC via a double data rate (DDR) bus.

The DRAM memory system is typically organized into a plurality of banks. Each bank may have dedicated bank resources (e.g., sense amplifier, row buffer, etc.) for accessing data stored in the bank's memory cell array. The dedicated resources service bank operations (e.g., refresh, read, write, etc.). Existing multi-bank memory cell arrays with dedicated bank resources are not energy efficient. For example, when the dedicated bank resources are used to refresh a row in the bank's memory cell array, the data in the opened page needs to be stored back to the memory cells, and then retrieved back to the row buffer after the refresh operation is completed. Furthermore, when the read/write requests are not evenly distributed across the banks, the resources in one bank may be relatively idle while those in another bank may be overloaded.

Accordingly, there is a need for improved systems and methods for efficiently using bank resources on memory devices to improve memory performance and power.

SUMMARY OF THE DISCLOSURE

Systems, methods, and computer programs are disclosed for providing coincident memory bank access. One embodiment is a memory device comprising a first bank, a second bank, a first bank resource, and a second bank resource. The first bank has a first set of bitlines for accessing a first set of rows in a first memory cell array. The second bank has a second set of bitlines for accessing a second set of rows in a second memory cell array. The first bank resource and the second bank resource are selectively connected to the first set of bitlines or the second set of bitlines via a cross-connect switch.

Another embodiment is a method for providing coincident memory bank access in a multi-bank memory array. The method comprises receiving coincident requests for a first row operation and a second row operation to a first bank in a multi-bank array. While delaying the second row operation, the first row operation is performed to the first bank by configuring a cross-connect switch to connect a first shared bank resource to a plurality of bitlines associated with the first bank for accessing a memory cell array. After completing the first row operation, the second row operation is performed to the first bank by configuring the cross-connect switch to connect a second shared bank resource to the plurality of bitlines associated with the first bank.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, a wearable device (e.g., a smart watch), a handheld computer with a wireless connection or link, or any other battery-powered computing device.

Figure 1:
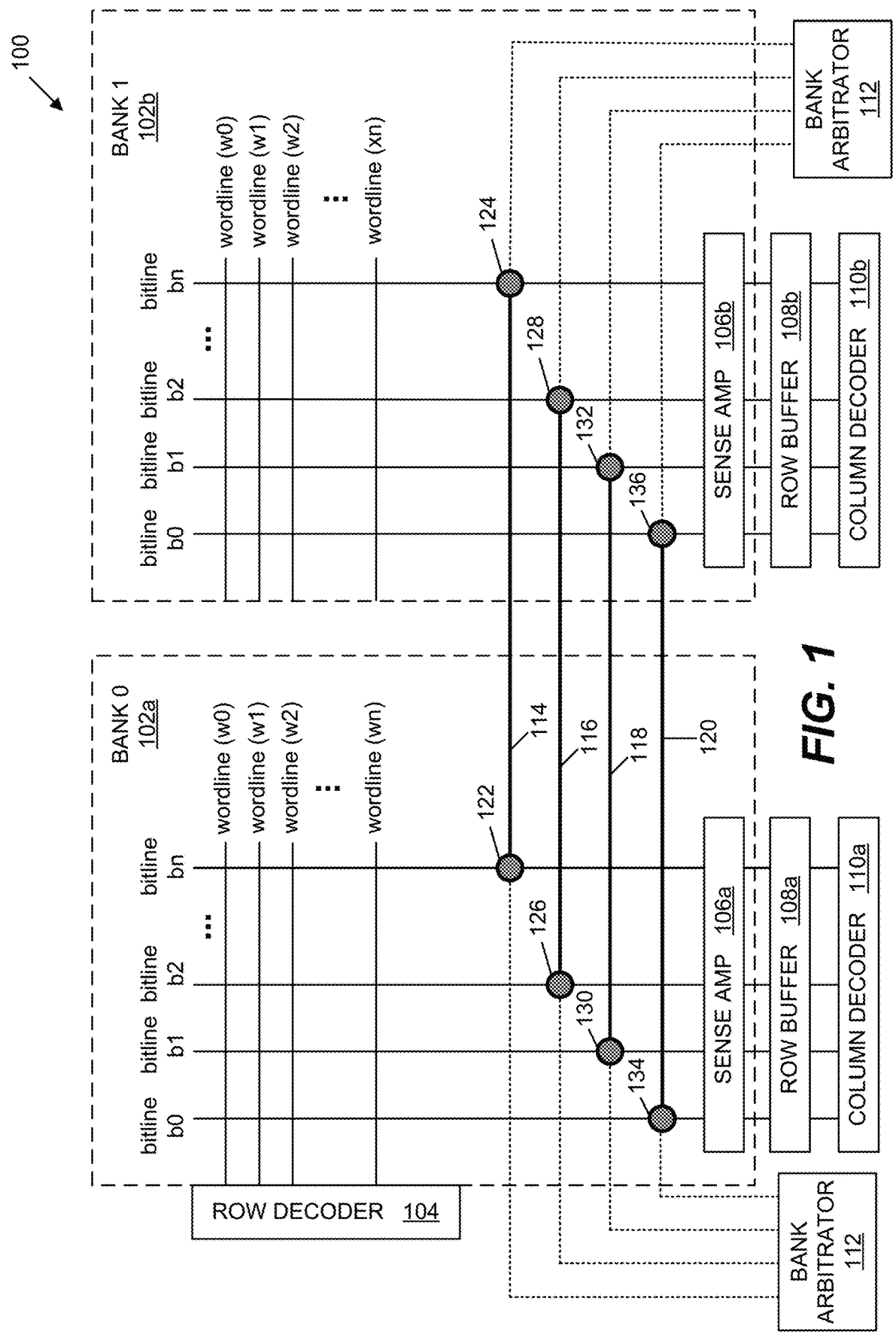
FIG. 1 is a block diagram of an embodiment of a multi-bank memory cell array for providing coincident memory bank access.

FIG. 1 illustrates an embodiment of a memory device 100 comprising a multi-bank memory array architecture for providing coincident memory bank access via cross-connected shared bank resources. The memory device 100 may be implemented in any computing device, including a personal computer, a workstation, a server, or a portable computing device (PCD), such as a cellular telephone, a smart phone, a portable digital assistant (PDA), a portable game console, a navigation device, a tablet computer, a wearable device (e.g., smart watch), or other battery-powered portable device. The memory device 100 may support various types of memory, including, for example, volatile memory, such as, dynamic random access memory (DRAM).

As illustrated in FIG. 1, the memory device 100 comprises a plurality of banks 102 forming a multi-bank memory cell array. FIG. 1 illustrates a pair of banks 102a (bank 0) and 102b (bank 1), although it should be appreciated that any number of banks may for the memory cell array. It should be further appreciated that banks 102a and 102b may represent a portion of the memory cell array (i.e., a subarray) with additional banks 102 forming the other subarrays comprising the memory cell array. Each bank 102 has a set of dedicated bank resources (e.g., sense amplifiers 106, row buffers 108, and column decoders 110), which service the operation of the corresponding bank. In the example of FIG. 1, a first bank 102a (bank 0) has a dedicated sense amplifier 106a, a row buffer 108a, and a column decoder 110a, and a second bank 102b (bank 1) has a dedicated sense amplifier 106b, a row buffer 108b, and a column decoder 110b. The memory cell array (or subarray) formed by the banks 102a and 102b comprises a plurality of memory cell elements arranged in rows (wordlines w0-wn) and columns (bitlines b0-bn). Each memory cell has a unique location or address defined by the intersection of the bitlines b0-bn and the wordlines w0-2n.

A row decoder 104 is connected to the wordlines w0-wn to determine the particular row of memory cells associated with a bank operation (e.g., read, write, refresh, etc.). For example, to perform a read of a row in bank 102a, the row decoder 104 may activate a wordline w1, which connects the memory cells at the intersection of bitlines b0-bn and the wordline w1. To read the data stored in the row of memory cells, the row is "opened" by connecting the sense amplifier 106a to the bitlines b0-bn. The memory cells in the open row are sensed by the sense amplifier 106b, and the sense amplifier 106b outputs the data to the row buffer 108a. A column decoder 110a is used to output the data to an external data bus.

As mentioned above, existing systems that use dedicated resources for bank operations suffer from energy inefficiency. For example, when the dedicated bank resources are used to refresh a row in the bank's memory cell array, the data in the opened page needs to be stored back to the memory cells, and then retrieved back to the row buffer after the refresh operation is completed. This process causes increased delay and power consumption. Furthermore, when the read/write requests are not evenly distributed across the banks, the resources in one bank may be relatively idle while those in another bank may be overloaded.

To address these and other deficiencies, the memory device 100 in FIG. 1 is configured to provide coincident memory bank access by cross-connecting both sets of dedicated bank resources to each of the banks. FIG. 1 illustrates an embodiment of a cross-connection mechanism in which the sense amplifier 106a (bank 0) and the sense amplifier 106b (bank 1) are cross-connected to each of the banks 102a and 102b. It should be appreciated that the cross-connection mechanism may be implemented in various ways to enable a bank arbitrator 112 to selectively connect the sense amplifiers 106a and 106b to either of the banks 102a and 102b during the performance of bank operations to a row in a particular bank (e.g., row open, close, refresh, etc.). In the embodiment illustrated in FIG. 1, each of the bitlines b0-bn for bank 102a are cross-connected to the corresponding bitlines b0-bn for bank 102b. Bitline b0 (bank 0) is cross-connected to bitline b0 (bank 1) via switches 134 and 136 connected by a trace 120. Bitline b1 (bank 0) is cross-connected to bitline b1 (bank 1) via switches 130 and 132 connected by a trace 118. Bitline b2 (bank 0) is cross-connected to bitline b2 (bank 1) via switches 126 and 128 connected by a trace 118. Bitline bn (bank 0) is cross-connected to bitline bn (bank 1) via switches 122 and 124 connected by a trace 124.

Figure 2:
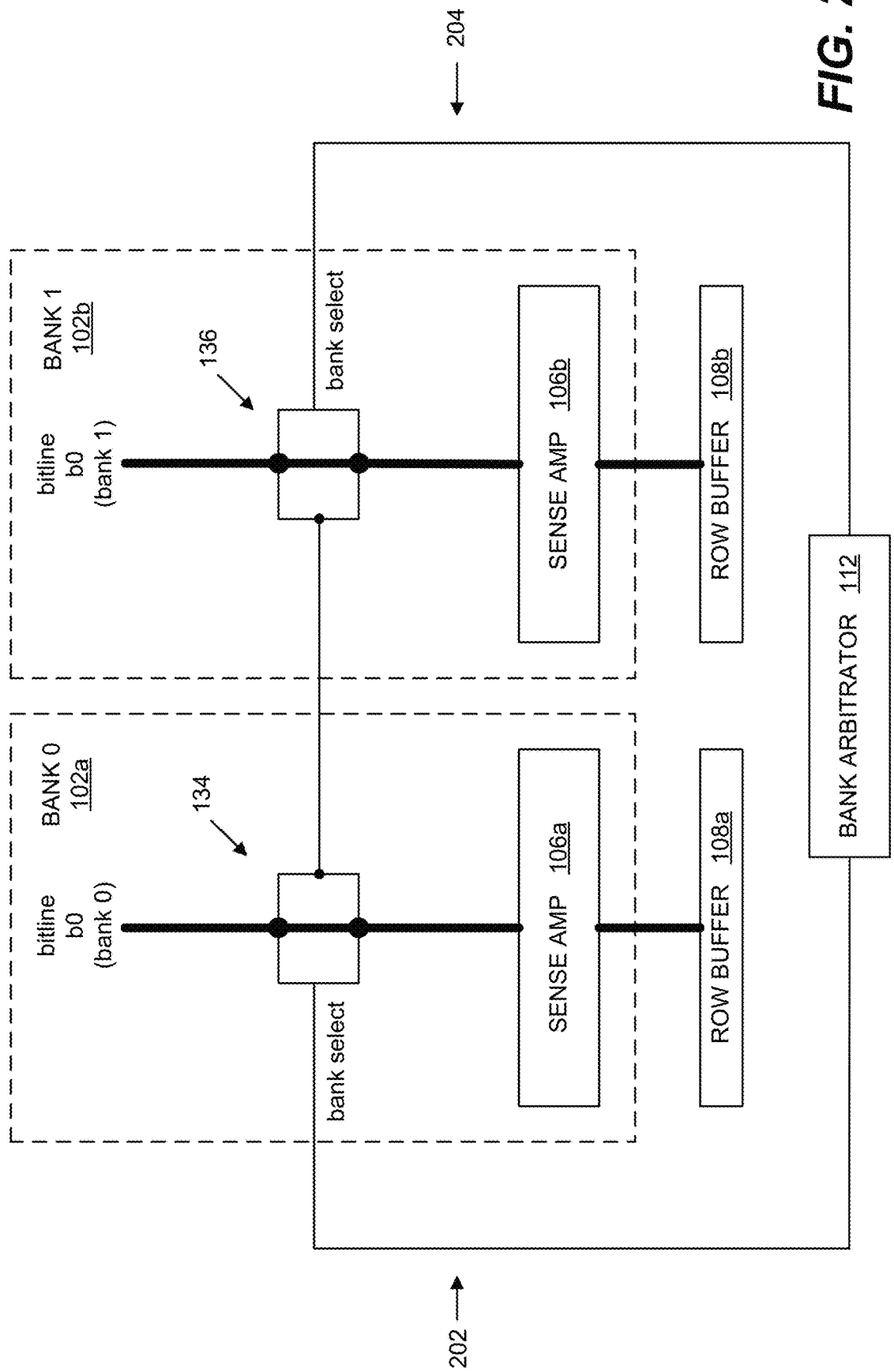
FIG. 2 is a circuit diagram illustrating an embodiment of a cross-connection of two shared sense amplifiers to two memory banks.
Figure 3:
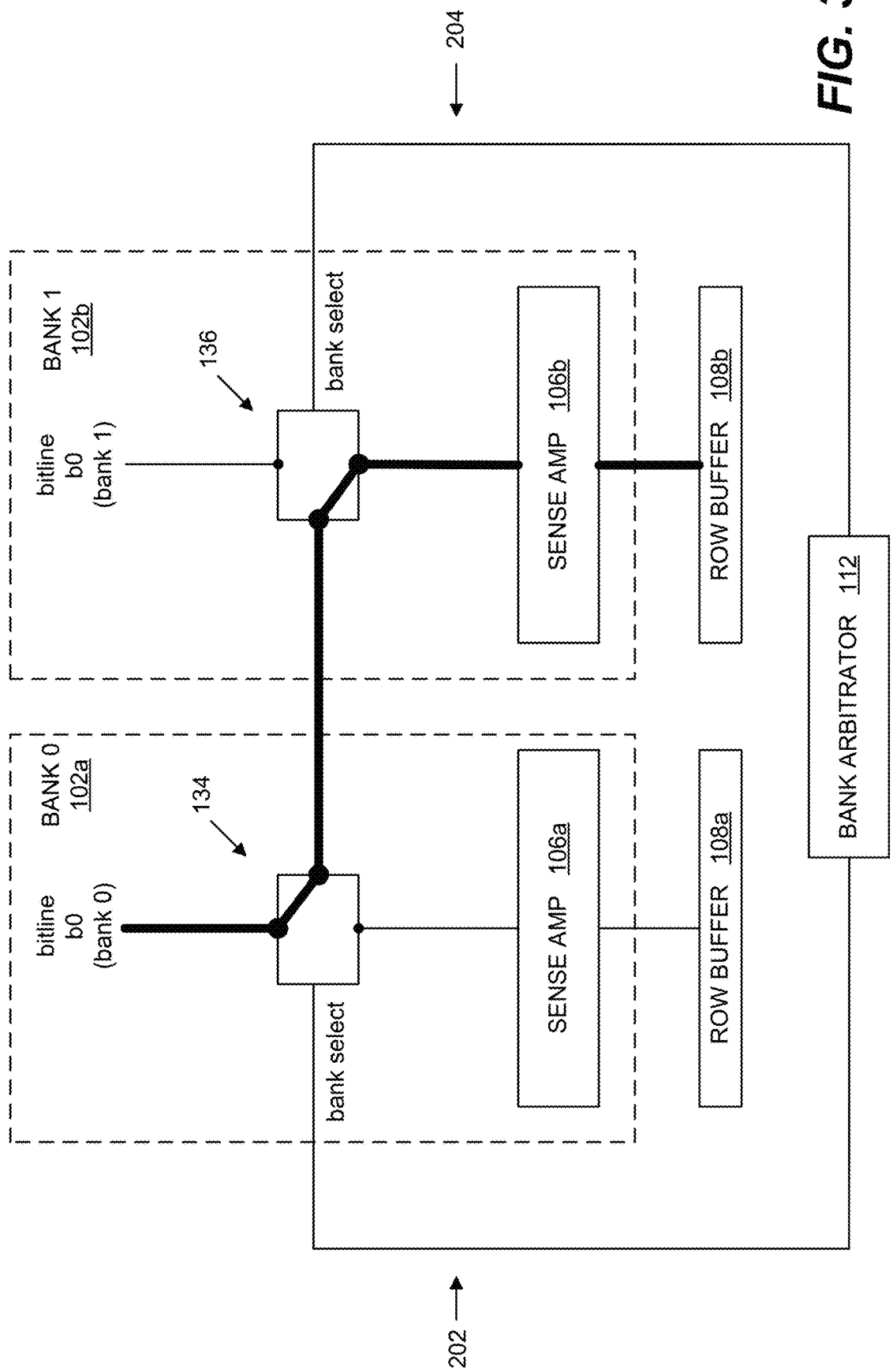
FIG. 3 illustrates the cross-connection of FIG. 2 in which the shared sense amplifier for a bank 1 is connected to a bank 0.

Each of switches 122, 124, 126, 128, 130, 132, 134, and 136 may be controlled by the bank arbitrator 112 to selectively connect the sense amplifiers 106a and 106b to the bitlines b0-bn corresponding to either bank 102a or 102b. FIGS. 2 & 3 illustrate in more detail the cross-connection of a single bitline b0 (bank 0) to bitline b0 (bank 1). FIG. 2 illustrates the switches 134 and 136 in a default mode in which the dedicated sense amplifiers 106a and 106b are connected to banks 102a and 102b, respectively. As described below in more detail, the cross-connection mechanism may be enabled by the bank arbitrator 112 sending a bank select signal to the switches 134 and 136 via connections 202 and 204, respectively. In FIG. 3, the bank arbitrator 112 has determined that sense amplifier 106b (bank 1) should be cross-connected to bank 102a. In response to the bank select signals from the bank arbitrator 112, the switch 134 connects bitline b0 (bank 0) to the trace 120, and the switch 136 connects bitline b0 (bank 1) to the trace 120. In this manner, the sense amplifier 106b is now connected to bank 0 instead of bank 1.

In this manner, the bank arbitrator 112 and the cross-connection mechanism may advantageously provide coincident memory bank access in memory device 100. For example, when two row operations to the same bank collide, the bank arbitrator 112 may be configured to sequence or serialize the row operations via the cross-connection mechanism. A first row operation to the bank 102a may be performed by connecting the dedicated sense amplifier 106a to bitlines b0-bn of bank 0 (FIG. 2). The second row operation may be subsequently performed by connecting the other dedicated sense amplifier 106b to the bitline b0-bn of bank 0 (FIG. 3). It should be appreciated that the first and second row operations requested of bank 0 may be, for example, a row refresh or a row activation associated with a read or write request.

Figure 4:
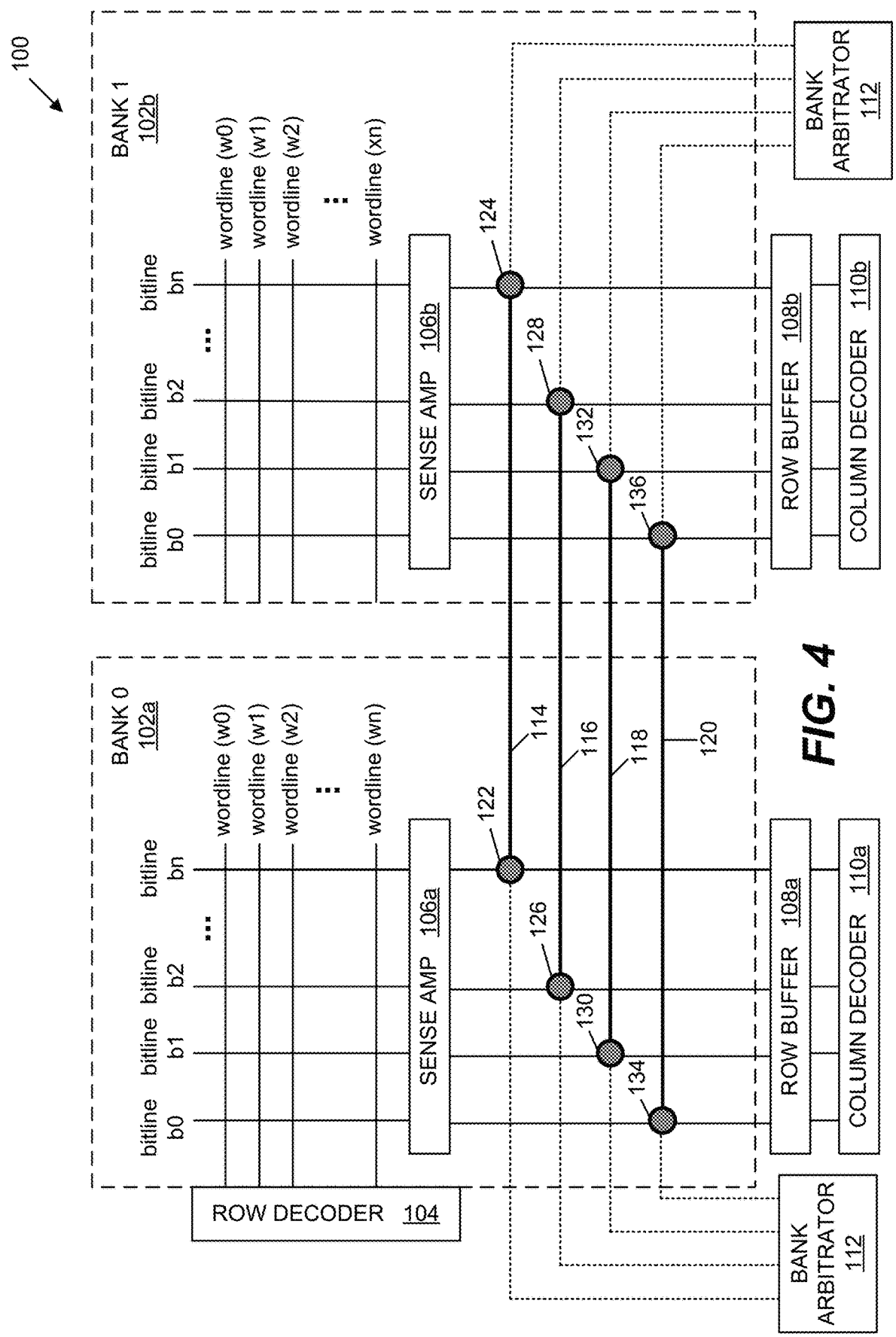
FIG. 4 is a block diagram of another embodiment of a multi-bank memory cell array for providing coincident memory bank access.

It should be appreciated that the banks 102a and 102b may be physical disposed in the memory device 100 in various configurations. In one embodiment, the banks 102a and 102b are physically disposed in the same plane. In other embodiments, the banks 102a and 102b (and their corresponding bank resources) may be physically disposed in the memory device 100 in a stacked arrangement. For example, bank 102a, sense amplifier 106a, row buffer 108a, and column decoder 110a may occupy a first plane. Bank 102b, sense amplifier 106b, row buffer 108b, and column decoder 110b may occupy a second plane with the cross-connection mechanism providing the plane-to-plane connections between the bitlines b0-bn. In an embodiment, the first and second planes may be physically disposed in a three-dimensional, stacked arrangement with one on top of the other. It should be further appreciated that the cross-connection mechanism may be used to selectively connect any of the dedicated bank resources to the banks 102a and 102b. FIG. 4 illustrates an embodiment of the memory device 100 in which the dedicated sense amplifiers 106a and 106b are connected to their corresponding bitlines b0-bn, and the cross-connection is applied to the row buffers 108a and 108b. In this embodiment, the sense amplifiers 106a and 106b are dedicated to bank 0 102a and bank 1 102b, respectively, but the row buffers may still be shared between banks. It should be appreciated that this alternative embodiment may provide an intermediate level of resource sharing between existing systems and the embodiment illustrated in FIG. 1.

Figure 5:
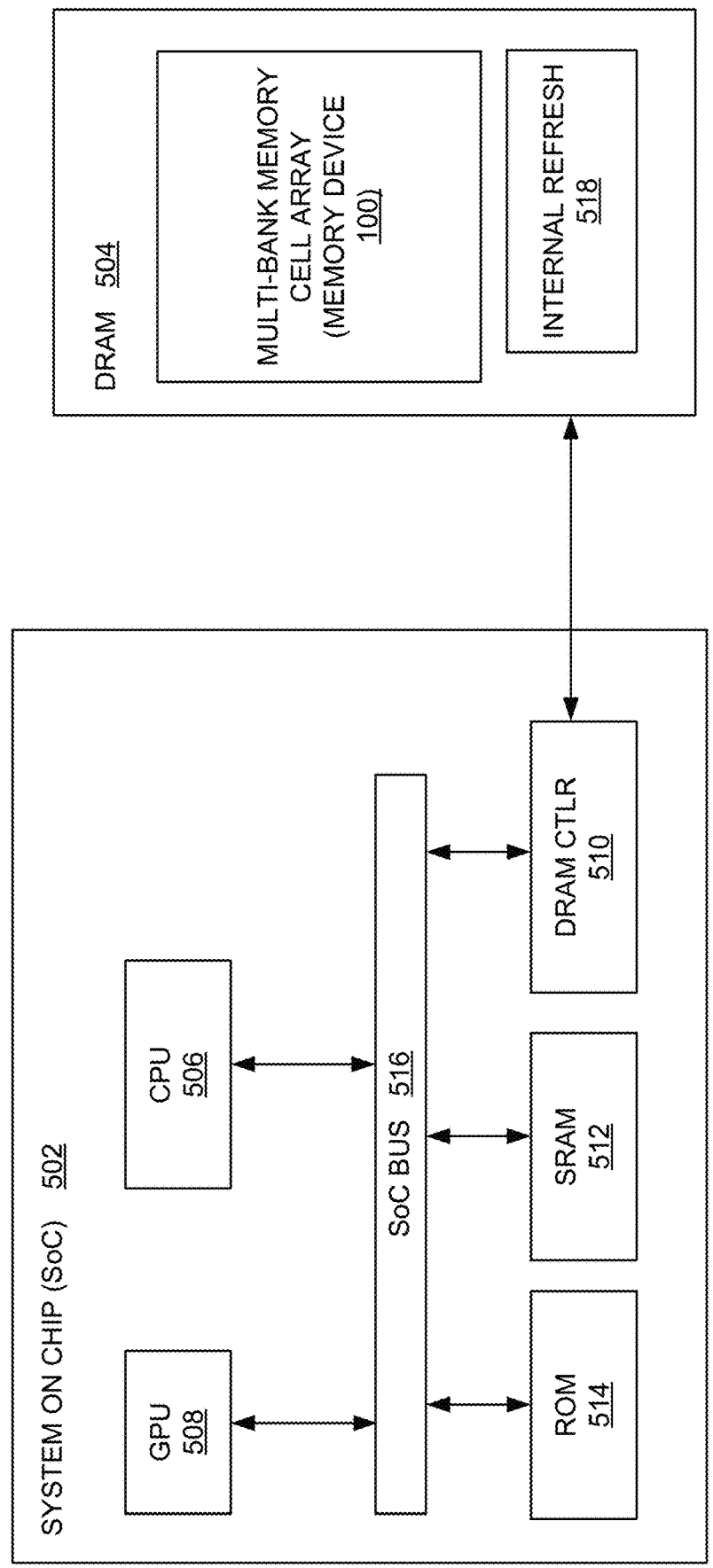
FIG. 5 is a block diagram of a computer system incorporating the multi-bank memory cell array of FIGS. 1 & 4.

FIG. 5 illustrates a computing system 500 that incorporates the multi-bank memory array architecture 100. As illustrated in FIG. 5, the system 500 comprises a system on chip (SoC) 502 electrically coupled to a dynamic random access memory (DRAM) device 504 via a random access memory (RAM) bus (e.g., a double data rate (DDR) bus). The DRAM device 504 comprises the memory device 100 and a specially-configured internal refresh module 518. The internal refresh module 518 is configured to manage the memory cell refreshing on the device, keep track of the refresh interval of each bank, and generate refresh operation to the rows in each and every bank 102. The internal refresh module 518 may also interface with the bank arbiter 112 when it decides to perform refresh operation of a give bank using the resource from another bank. The SoC 502 comprises various on-chip components, including a plurality of memory clients, a DRAM controller 510 interconnected via a SoC bus 516. The memory clients may comprise one or more processing units (e.g., a central processing unit (CPU) 506, a graphics processing unit (GPU) 508, a digital signal processor (DSP), or other memory clients requesting read/write access to the DRAM 504. The SoC 502 may further comprise on-chip memory devices, such as, static random access memory (SRAM) 512 and read only memory (ROM) 514.

While the internal refresh module 518 is given a set of resource to perform refresh operation on one bank 0 102a, it may also perform refresh operation of a second bank 102b, if the refresh timeline for the rows in bank 102b is close enough within a programmable duration. In doing so, it may reduce the need of a future case when all resources are used for read/write requests, and has to write back the data from the sense amplifier to the row in order to free up the resource for refresh operation, thereby reducing power consumption.

The SoC masters (e.g., CPU 506, GPU 508, digital signal processor(s), etc.) may issue DRAM memory access requests by sending read/write request to an address within SoC assigned DRAM address. The DRAM controller 510 translates the address into a corresponding bank, row, and column address. At or near the same time, the refresh module 518 within the DRAM 504 may also periodically generate commands for refresh operation. Depending on the traffic pattern from the masters and the level of concurrency, the read/write requests and refresh operations may be distributed into different banks, or may have coincident access towards one bank but different rows. The cross-connection mechanism described above may be employed during coincident access to a single bank.

Figure 6:
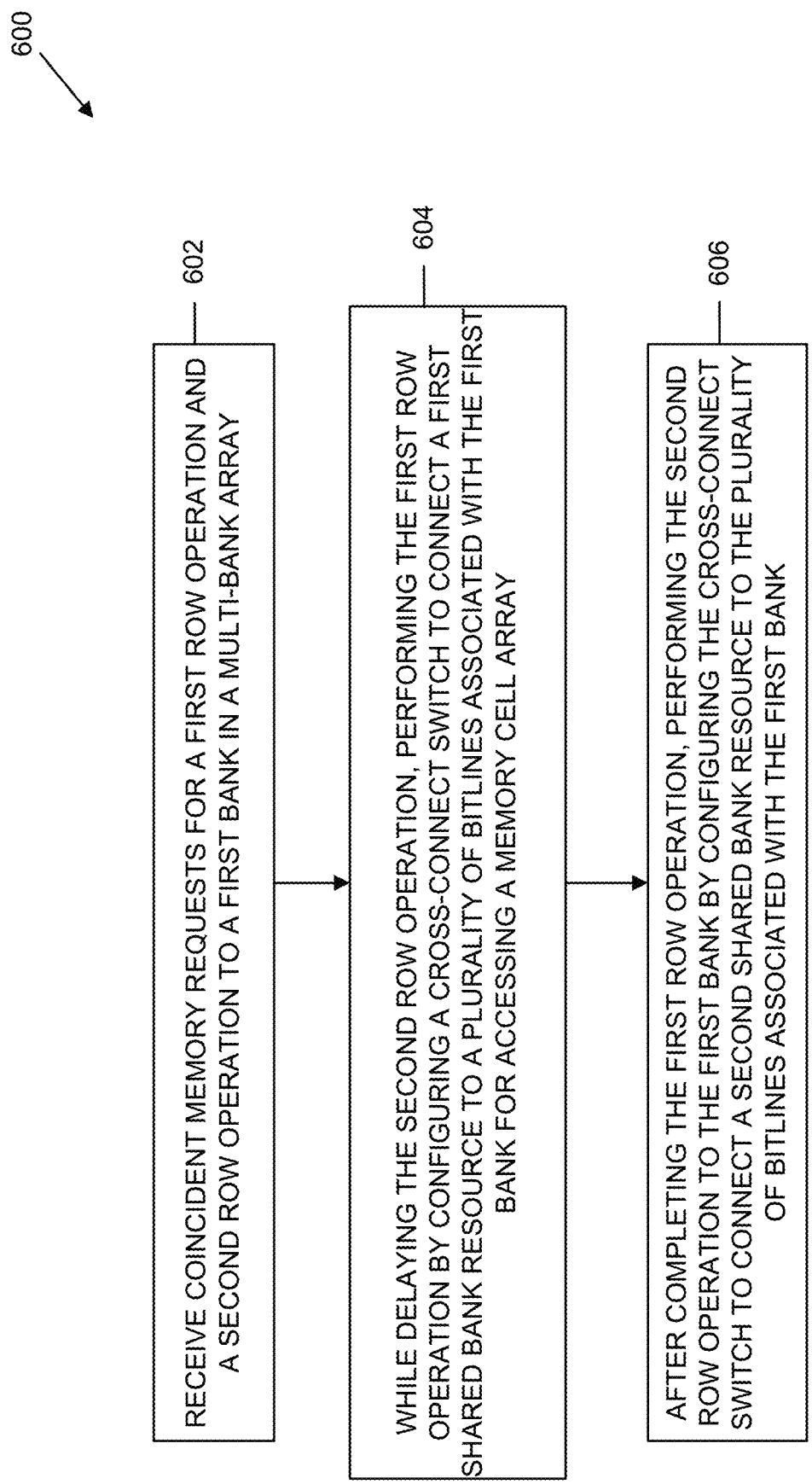
FIG. 6 is a flowchart illustrating an embodiment of a method for providing coincident memory bank access via the cross-connect architecture of FIGS. 1-4.
Figure 7:
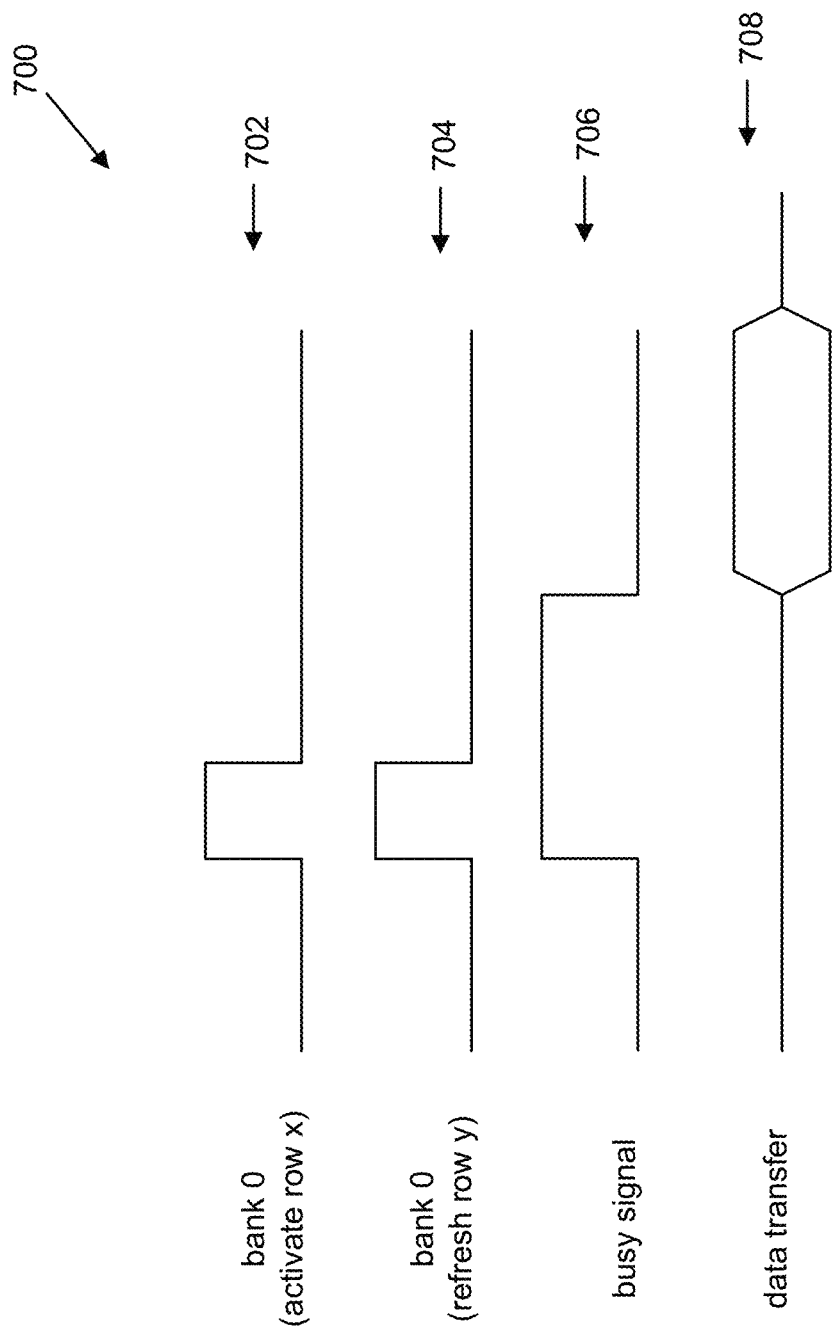
FIG. 7 are timing diagrams associated with an exemplary method for providing coincident memory bank access.

FIG. 6 illustrates an embodiment of a method 600 for providing coincident memory bank access in the memory device 100 via the cross-connection mechanism. At block 602, coincident requests may be received for a first row operation and a second row operation to the same bank in a multi-bank memory cell array. The coincident requests to the same bank may result in a bank collision situation that is determined by the bank arbitrator 112. For example, referring to FIG. 7, a first request for a first row operation (timeline 702) may be received from the DRAM controller 510. The first row operation may comprise a row activation for a row x in bank 102a. At or near the same time, a second request for a second row operation (timeline 704) may be received. The second row operation may comprise a refresh to a row y in bank 102a generated by the internal refresh module 518. To resolve the bank collision, the refresh operation may be given the priority to use the resources in consideration of preventing data lost if not refreshing in time. The bank arbitrator 112 may delay the first row operation (row activation for row x). At block 604, while delaying the first row operation, the second row operation (refresh row y) may be performed by configuring the cross-connect mechanism to connect dedicated sense amplifier 106a to the bitlines b0-bn associated with the bank 102a (bank 0). After completing the second row operation, at block 606, the first row operation (row activation for row x) may be performed by configuring the cross-connect mechanism to connect the dedicated sense amplifier 106b to the bitlines b0-bn associated with the bank 102a (bank 0). Referring to FIG. 7, because the first row operation (row activation for row x) can be delayed, the DRAM controller 510 may no longer expect the data to transfer back at a deterministic manner. The bank arbitrator 112 may be configured to send a busy signal (timeline 706) to the SoC 502, which indicates that the row activation for row x is being delayed pending the refresh operation for row y, and the data is not ready yet. After the refresh of row y is performed, the bank arbitrator 112 the row activation for row x may proceed (timeline 708). The DRAM controller 510 may detect that the DRAM 504 no longer sends out the busy signal, and proceed to receive the data.

Figure 8:
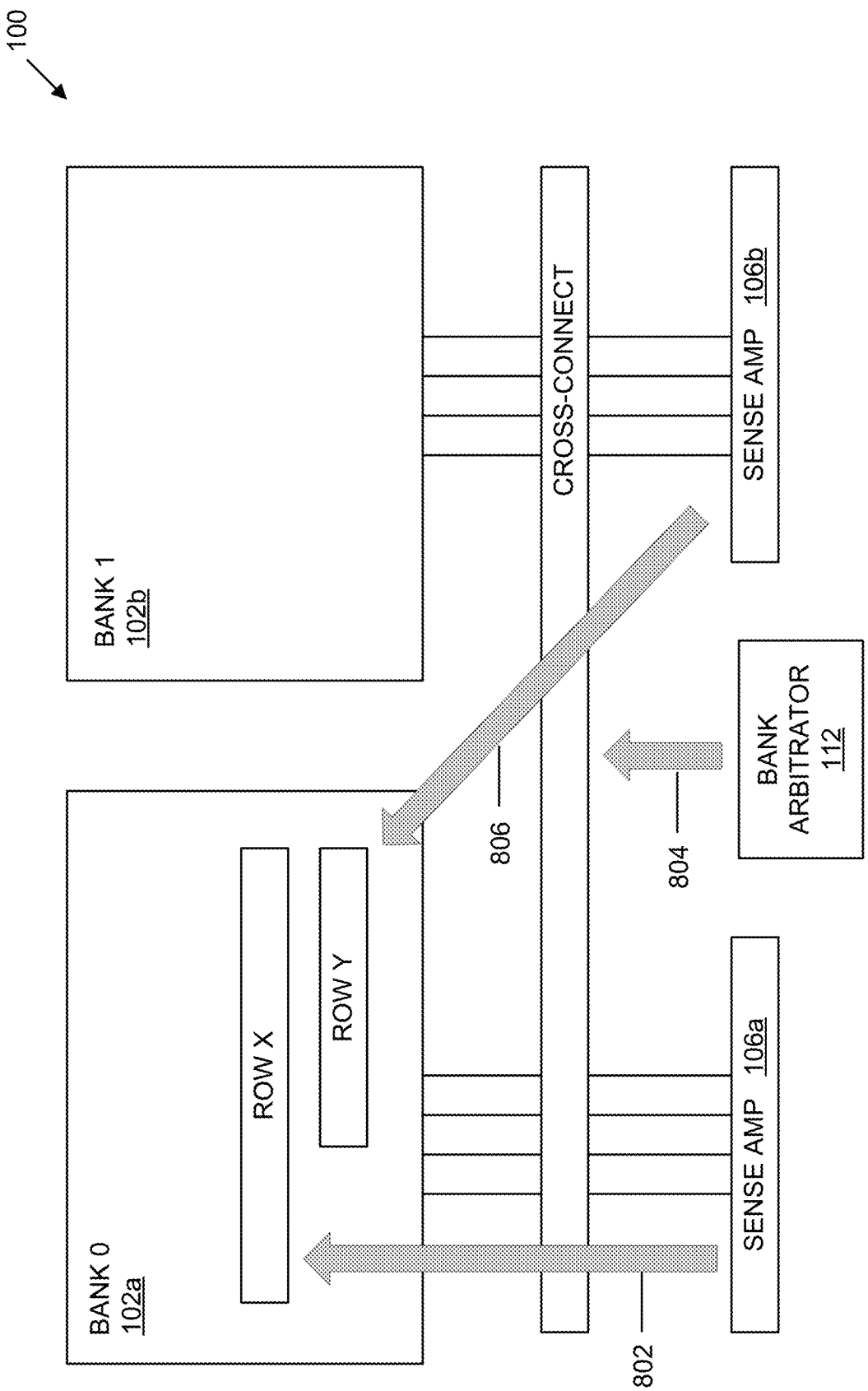
FIG. 8 is a combined flow/block diagram illustrating an exemplary embodiment of a method for providing memory bank access associated with coincident row and refresh operations.

FIG. 8 illustrates in schematic form the above example for resolving the bank conflict. Arrow 806 shows the operation to row y via sense amplifier 106b. Arrow 804 shows the bank arbitrator 112 sending a bank select signal to reconfigure the cross-connect mechanism. Arrow 802 shows the row activation to row x via the sense amplifier 106a.

As known in the art, the memory device 100 (e.g., DRAM 504) may be periodically refreshed on a row-by-row basis. The refresh may be performed at a minimum rate that will maintain the DRAM contents while conserving power. It should be appreciated that when the internal refresh module generate refresh operation to a group of rows in the first bank 102a, since it obtains a set of shared bank resource (sense AMP) for the refresh operation, it may as well use the set of resource to generate refresh operation to another group of rows in the second bank 102b, if the timeline for refresh is close for this group of rows in the second bank 102b. In doing so, it reduce the chance for future coincident access to the second bank 102b, and avoid the delay indicated by the busy signal 706 in FIG. 7. It should be appreciated that the feature enablement of this behavior can be programmable.

One of ordinary skill in the art will readily appreciate that the cross-connection mechanisms described above may be advantageously used to further provide various improved applications for memory device 100. In one exemplary embodiment, the cross-connection mechanisms may be leveraged to provide row tamper protection. It should be appreciated that the intervals between refreshes may represent a potential security risk or vulnerability that may be exploited by adversaries. For example, a software attack may create DRAM traffic that produces heavily localized behavior. DRAM refresh and timing parameters may not be altered because they are embedded within, for example, a secure driver or hardware. However, during refresh intervals, an adversary may intentionally disturb the contents of one or more rows by producing an unusually high amount of row activity (e.g., page open, page close) in a localized region of the memory cell array. The high activity may cause data in adjacent rows to change state, resulting in corrupted data that may crash the system or allow a security exploit to take over.

Figure 9:
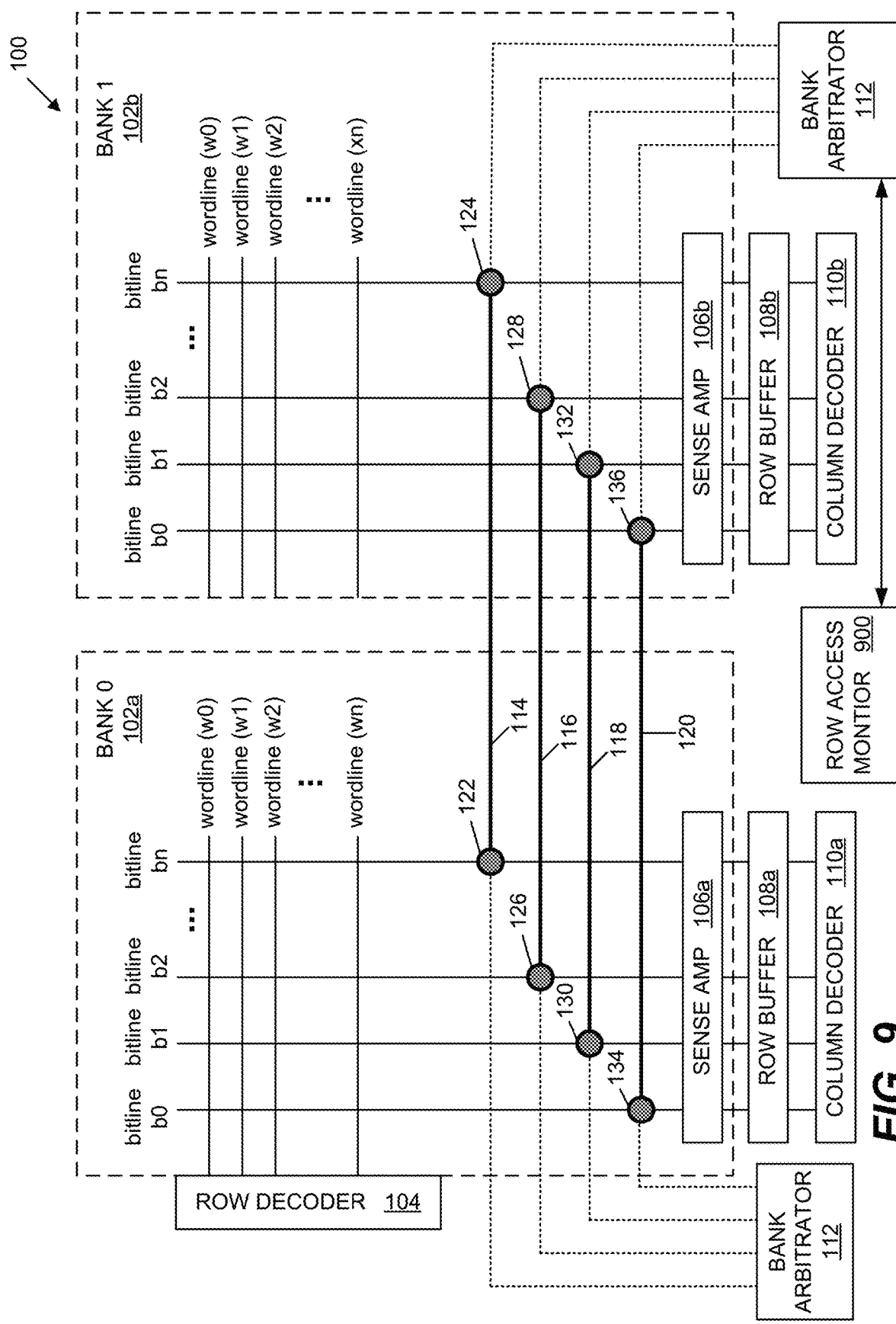
FIG. 9 is a block diagram of a system incorporating the cross-connect architecture of FIGS. 1-4 for providing row tamper protection.
Figure 10:
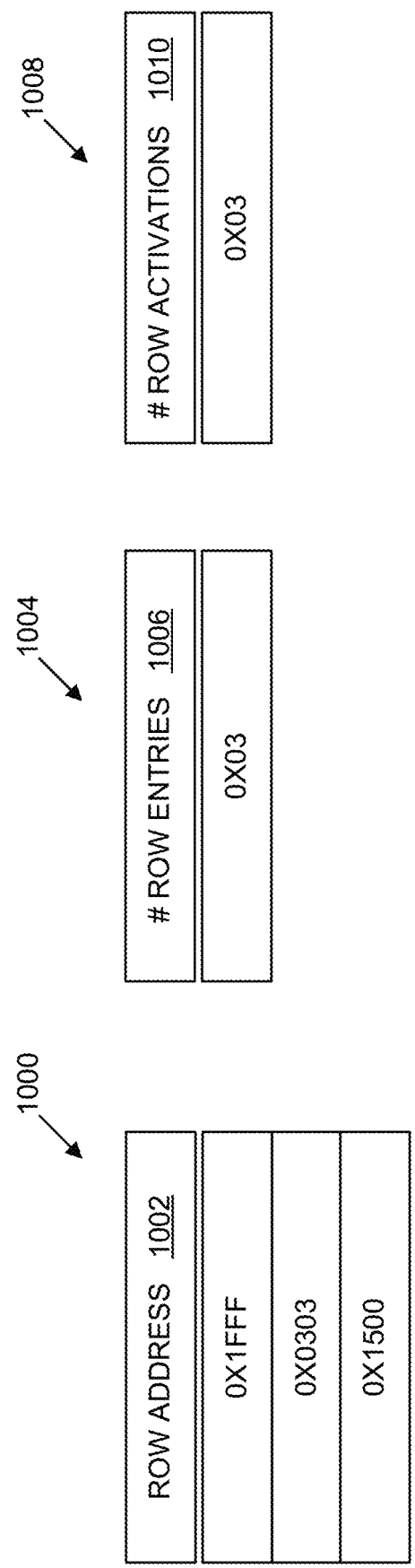
FIG. 10 illustrates various exemplary tables for implementing row tamper protection via the system of FIG. 9.

FIG. 9 illustrates another embodiment of the memory device 100, which includes a row access monitor 900 configured to provide row tamper protection against these security vulnerabilities. The memory device 100 may be configured in the manner described above with the addition of the row access monitor 900. In an embodiment, the row access monitor 900 is configured to keep track of a number of bank row activations and the row addresses associated with the bank row activations. FIG. 10 illustrates exemplary data structures for maintaining a row activation counter table. The row activation counter table comprises a list 1000 of row addresses 1002 with corresponding counters 1004 and 1008 for keeping track of the number of row entries and a number of row activations, respectively.

As illustrated in FIG. 10, the row addresses list 1002 may store the unique row addresses that have been activated per bank. The list 1002 may be implemented up to a certain maximum capacity. The value for the maximum capacity can be scaled by the factor of the maximum number of rows to be activated within on refresh interval. FIG. 10 illustrates three exemplary list entries that have been used to record the activation on row number 0x1FFF, 0x0303, and 0x1500. The # of row entries counter 1006 keeps track of the valid entries in the list 1002, three in this example. The number of row activations counter 1010 keeps track of the total number of the activations toward the bank with the number being incremented each time an activation occurs toward the whole bank. If a ratio of (# row activations) to (# row entries counter 1006 exceeds a programmable threshold (ratio_max), then the row access monitor 900 may determine that a row hammering even is detected. It then interfaces with the internal refresh module 518 to perform refresh on all neighbor rows, which are adjacent to any of the stored row entries.

It should be appreciated that the internal refresh module 518 enables the system 500 to control the refresh of the memory cells from within the DRAM 504 without depending on the refresh command from the DRAM controller 510. Upon detection of row hammering, the row access monitor 900 may communicate the bank address and row address of the rows that require additional refresh to the internal refresh module 518. The internal refresh module 518 makes use of the cross-connect mechanism to perform refresh operation.

Figure 11:
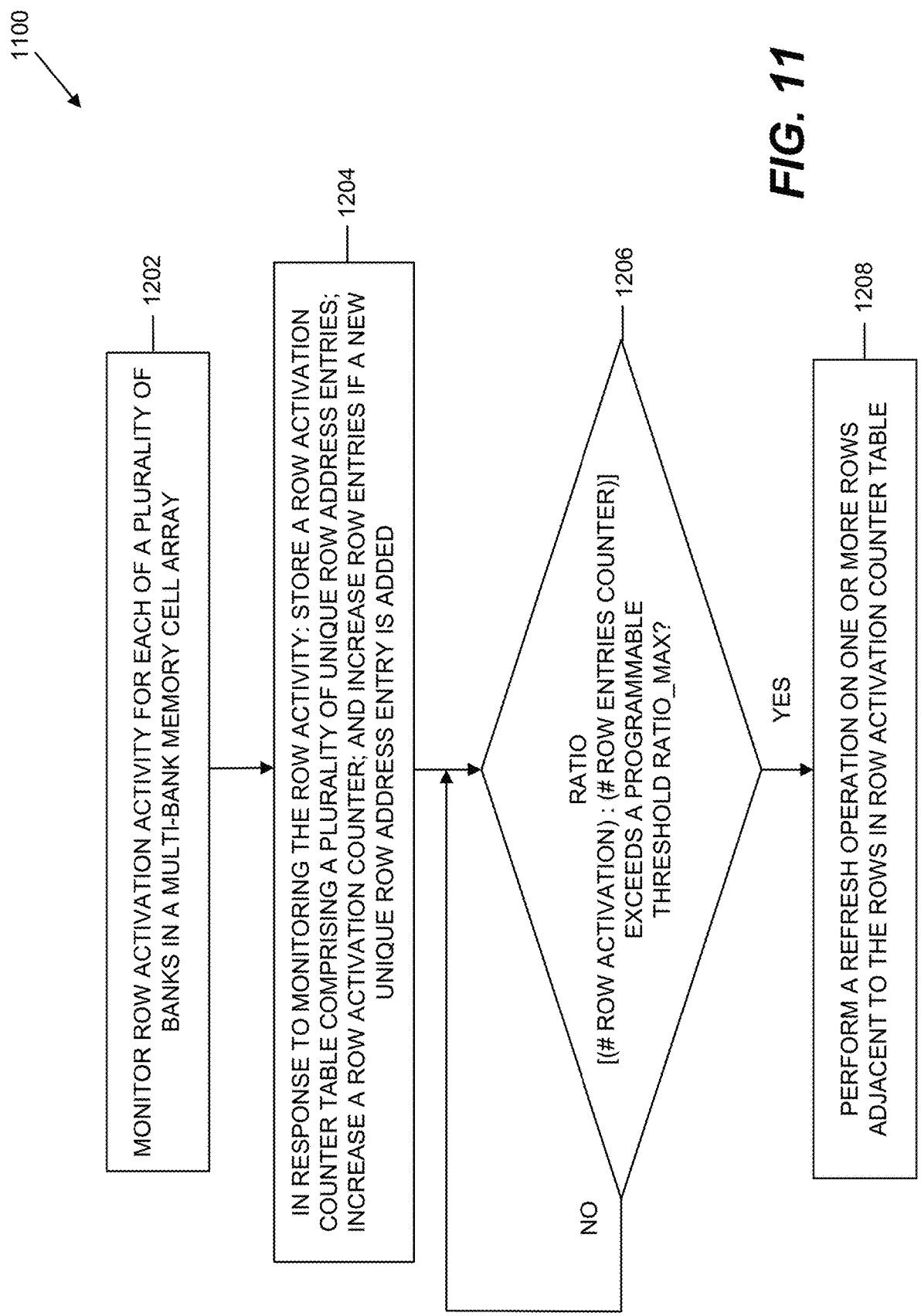
FIG. 11 is a flowchart illustrating an embodiment of a method for providing row tamper protection in a multi-bank memory cell array.

FIG. 11 illustrates an embodiment of a method 1100 implemented by the row access monitor 900. At block 1102, the row access monitor 900 monitors row activation activity for each of the banks 102a and 102b in the memory device 100. In response to monitoring the row activation activity, at block 1204, the row access monitor stores a row activation counter table (FIG. 10) comprising a plurality of row address entries 1000. A new unique row address entry may be recorded if the entry does not exist in the table 1000. The row access monitor 900 may also increase the # row entries counter 1006 each time a new entry is added, and increase the # row activations counter 1010 each time an activation occurs in the bank. At decision block 1106, the row access monitor 900 may detect that the ratio [(# row activation counters 1010):(# row entries 1006)] has exceeded a predetermined or programmable threshold indicating suspicious row tampering. At block 1108, the row access monitor 900 initiates a refresh operation for one or more rows adjacent to the row address entries listed in the table 1002.

In response to detecting the row hammering, an SoC "root of trust" may make use of such information to take various proactive measures to, for example, control and prevent an attack. In this regard, it should be appreciated that various methods may be employed to communicate the row hammering the SoC 102. In an embodiment, the DRAM 504 may use a combination of dedicated hardware signals and or internal read/write registers to indicate to the SoC 102 the information of the attack (e.g., an address associated with the attack).

Figure 12:
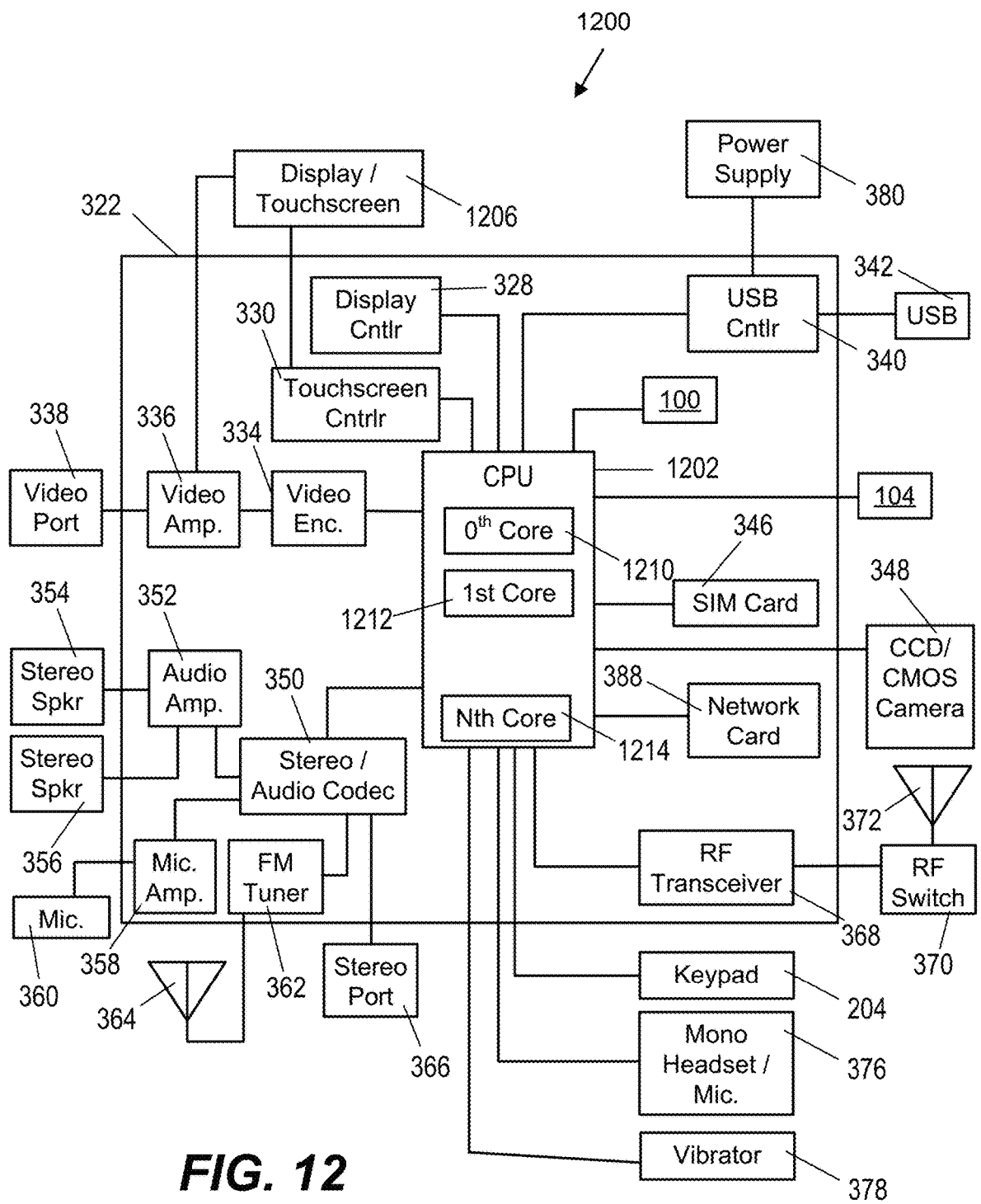
FIG. 12 is a block diagram of an embodiment of a portable computing device for incorporating the multi-bank cross-connect architectures of FIGS. 1-11.

As mentioned above, the system 100 may be incorporated into any desirable computing system. FIG. 12 illustrates the memory device 100 incorporated in an exemplary portable computing device (PCD) 1200. It will be readily appreciated that certain components of the memory device 100. The SoC 322 may include a multicore CPU 1202. The multicore CPU 1202 may include a zeroth core 1210, a first core 1212, and an Nth core 1214. One of the cores may comprise, for example, a graphics processing unit (GPU) with one or more of the others comprising the CPU.

A display controller 328 and a touch screen controller 330 may be coupled to the CPU 1202. In turn, the touch screen display 1206 external to the on-chip system 322 may be coupled to the display controller 328 and the touch screen controller 330.

FIG. 12 further shows that a video encoder 334, e.g., a phase alternating line (PAL) encoder, a sequential color a memoire (SECAM) encoder, or a national television system (s) committee (NTSC) encoder, is coupled to the multicore CPU 1202. Further, a video amplifier 336 is coupled to the video encoder 334 and the touch screen display 1206. Also, a video port 338 is coupled to the video amplifier 336. As shown in FIG. 12, a universal serial bus (USB) controller 340 is coupled to the multicore CPU 1202. Also, a USB port 342 is coupled to the USB controller 340. Memory 104 and a subscriber identity module (SIM) card 346 may also be coupled to the multicore CPU 1202.

Further, as shown in FIG. 12, a digital camera 348 may be coupled to the multicore CPU 1202. In an exemplary aspect, the digital camera 348 is a charge-coupled device (CCD) camera or a complementary metal-oxide semiconductor (CMOS) camera.

As further illustrated in FIG. 12, a stereo audio coder-decoder (CODEC) 350 may be coupled to the multicore CPU 1202. Moreover, an audio amplifier 352 may be coupled to the stereo audio CODEC 350. In an exemplary aspect, a first stereo speaker 354 and a second stereo speaker 356 are coupled to the audio amplifier 352. FIG. 12 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 12 further illustrates that a radio frequency (RF) transceiver 368 may be coupled to the multicore CPU 1202. An RF switch 370 may be coupled to the RF transceiver 368 and an RF antenna 372. A keypad 204 may be coupled to the multicore CPU 1202. Also, a mono headset with a microphone 376 may be coupled to the multicore CPU 1202. Further, a vibrator device 378 may be coupled to the multicore CPU 1202.

FIG. 12 also shows that a power supply 380 may be coupled to the on-chip system 322. In a particular aspect, the power supply 380 is a direct current (DC) power supply that provides power to the various components of the PCD 500 that require power. Further, in a particular aspect, the power supply is a rechargeable DC battery or a DC power supply that is derived from an alternating current (AC) to DC transformer that is connected to an AC power source.

FIG. 12 further indicates that the PCD 1200 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 12, the touch screen display 1206, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A memory device with coincident memory bank access, the memory device comprising:
   a first bank having a first set of bitlines for accessing a first set of rows in a first memory cell array; each of the first set of bitlines being connected by one cross-connect switch located within the first bank to a first sense amplifier, the first sense amplifier being positioned within the first bank and coupled to a first row buffer;
   a second bank having a second set of bitlines for accessing a second set of rows in a second memory cell array; each of the second set of bitlines being connected by one cross-connect switch located within the second bank to a second sense amplifier, the second sense amplifier being positioned within the second bank and coupled to a second row buffer;
   the first sense amplifier being selectively connected to each bitline of the second set of bitlines of the second bank by a pair a cross-connect switches, where each pair of cross-connect switches is formed by one cross-connect switch within the first bank coupled to one cross-connect switch of the second bank by a circuit trace; the second sense amplifier being selectively connected to each bitline of the first set of bitlines of the first bank by a respective pair of the cross-connect switches;
   a first bank arbitrator coupled to each cross-connect switch of the first bank with a separate circuit trace, the first bank arbitrator controls each cross-connect switch of the first bank via one or more bank select signals; and
   a second bank arbitrator coupled to each cross-connect switch of the second bank with a separate circuit trace, the second bank arbitrator controls each cross-connect switch of the second bank via one or more bank select signals.

2. The memory device of claim 1, wherein at least one of the first and second bank arbitrators configures one or more cross-connect switches to sequence a first row operation and a second row operation to the first bank.

3. The memory device of claim 2, wherein the first row operation is performed by selectively connecting the first sense amplifier to the first set of bitlines via the one or more cross-connect switches, and the second row operation is performed by selectively connecting the second sense amplifier to the first set of bitlines via the one or more cross-connect switches.

4. The memory device of claim 3, wherein the first row operation comprises one of a refresh operation and a row activation operation, and the second row operation comprises the other of the refresh operation and the row activation operation.

5. The memory device of claim 1, wherein the first bank and the first sense amplifier are disposed in a first plane, and the second bank and the second sense amplifier are disposed in a second plane.

6. The memory device of claim 1, wherein the first and second banks form a dynamic random access memory (DRAM), and the first memory cell array and the second memory cell array are subarrays within the DRAM.

7. A memory device with coincident memory bank access, the memory device comprising:
   means for storing data in a first memory cell array accessed via a first set of bitlines; each of the first set of bitlines being connected by one cross-connect switch located within the first means for storing to a first sense amplifier, the first sense amplifier being positioned within the means for storing data in the first memory cell array and coupled to a first row buffer;
   means for storing data in a second memory cell array accessed via a second set of bitlines; each of the second set of bitlines being connected by one cross-connect switch located within the second means for storing to a second sense amplifier, the second sense amplifier being positioned within the means for storing data in the second memory cell array and coupled to a second row buffer;
   means for selectively connecting the first sense amplifier to each bitline of the second set of bitlines of the second means for storing by using a pair a cross-connect switches, where each pair of cross-connect switches is formed by one cross-connect switch within the first means for storing coupled to one cross-connect switch of the second means for storing by a circuit trace; the means for selectively connecting also selectively connecting the second sense amplifier to each bitline of the first set of bitlines of the first means for storing by a respective pair of the cross-connect switches; and
   the means for selectively connecting comprising first and second arbitrator modules coupled to each pair of cross-connect switches, the first arbitrator module being coupled to a respective cross-connect switch within the first means for storing by a circuit trace, the second arbitrator module being coupled to a respective cross-connect switch within the second means for storing by a circuit trace, each arbitrator module controlling a respective cross-connect switch within a bank via one or more memory cell select signals.

8. The memory device of claim 7, further comprising:
   means for generating a refresh operation to one or more banks when a refresh timeline is approaching.

9. The memory device of claim 7, further comprising:
   means for sequencing a first row operation and a second row operation to the first bank.

10. The memory device of claim 9, wherein the first row operation is performed by selectively connecting the first sense amplifier to the first set of bitlines via one or more of the cross-connect switches, and the second row operation is performed by selectively connecting the second sense amplifier to the first set of bitlines via one or more of the cross-connect switches.

11. The memory device of claim 10, wherein the first row operation comprises one of a refresh operation and a row activation operation, and the second row operation comprises the other of the refresh operation and the row activation operation.

12. The memory device of claim 7, wherein the means for storing data in the first memory cell array and the second memory cell array form a dynamic random access memory (DRAM) subarrays.

* * * * *